United States Patent
Chang et al.

(10) Patent No.: US 8,736,289 B2
(45) Date of Patent: May 27, 2014

(54) BURN-IN TEST APPARATUS WITH FUNCTION OF ENERGY RECYCLING

(75) Inventors: Hong-Chan Chang, Taipei (TW); Cheng-Chien Kuo, New Taipei (TW); Chien Huangli, New Taipei (TW)

(73) Assignee: National Taiwan University of Science and Technology, Taipei (TW)

( * ) Notice: Subject to any disclaimer, the term of this patent is extended or adjusted under 35 U.S.C. 154(b) by 140 days.

(21) Appl. No.: 13/609,268

(22) Filed: Sep. 11, 2012

(65) Prior Publication Data
US 2013/0127482 A1 May 23, 2013

(30) Foreign Application Priority Data
Nov. 18, 2011 (TW) .............................. 100142430 A

(51) Int. Cl.
*G01R 31/10* (2006.01)
(52) U.S. Cl.
USPC .................................................. 324/750.05
(58) Field of Classification Search
USPC .................. 324/762.01–762.1, 750.01–750.3
See application file for complete search history.

(56) References Cited

U.S. PATENT DOCUMENTS 6,484,279 B2 * 11/2002 Akram .......................... 714/724
8,362,796 B2 * 1/2013 Pagani ..................... 324/762.02

OTHER PUBLICATIONS

Huangli, Chien; Chang, Hong-Chan; Kuo, Cheng-Chien; Chen, Cheng-Chuan; A Novel Single-Stage Isolated Burn-in Test Equipment with High Energy Recovery; Research Article; Jun. 30, 2012; pp. 457-462(6); vol. 13, No. 1, American Scientific Publishers; USA.
Huangli, Chien; Study of Advanced Energy Management System and Test Equipment with Energy Recycle; graduation theses for doctorate degree (Jan. 13, 2012) & Verification letter with signature from the Oral Examination Committee(Jan. 4, 2012);p. 1-111 & Appendix to prove date of publication, National Taiwan University of Science and Technology, Taipei City, Taiwan.

* cited by examiner

*Primary Examiner* — Tung X Nguyen
(74) *Attorney, Agent, or Firm* — Chih Feng Yeh; Huntington IP Consulting Co., Ltd.

(57) ABSTRACT

A new electrical recycling apparatus for AC/DC power converter is provided to recycle the electricity in direct current to the input ends of the power converter to be tested to save a stage of power converter and avoid the complicated standard and requirement that feed the electricity to the mains supply.

13 Claims, 4 Drawing Sheets

BURN-IN TEST APPARATUS WITH FUNCTION OF ENERGY RECYCLING

CROSS-REFERENCE TO RELATED APPLICATION

This present application claims priority to TAIWAN Patent application Ser. No. 100142430, filed on Nov. 18, 2011, which is herein incorporated by reference in its integrity.

TECHNICAL FIELD

The invention is relevant to a burn-in test apparatus, especially which can test the power converter, and recycle energy.

DESCRIPTION OF THE RELATED ART

In the competition of the business, the manufactures have to not only meet the industrial standard but also guarantee the reliability and quality. If the defect products cannot be filtered out before shipping the products, it may affect the goodwill and increase the cost. Therefore, the manufactures of the power converter will do the burn-in test before delivering the products.

Besides keeping the quality of the products, lots of countries and enterprises promote the carbon footprint labels, which are required to be provided by manufactures and their suppliers. Therefore, besides the advanced technology and reliability of the products, the carbon footprint labels are also a competitive item in the future market. Naturally, the requirement for low carbon footprint, i.e., low power consuming, is the testing item before shipping the products.

In the burn-in test, the output ends of the power converters to be tested are connected to the burn-in test apparatus, which provides the electrical load on the power converters to do the test. Among them, the electrical load includes the passive electrical load and the active electrical load.

The passive electrical load mainly includes the resistance load boxes, which are sensitive to the output voltage of the power converters to be tested, the temperature coefficients of the resistance and no-feedback control, and thus the testing current are not stable.

The active electrical load includes a stage of switch between the power converter to be tested and the resistance load box, and the switch can control and keep the current stable. Further, the switch can change the testing current dynamically, and thus the active electrical load dominates.

However, both of the passive electrical load and active electrical load need the resistance load boxes, which consume the electricity and result in heat. Thus, fans are required to cool down the resistance load boxes, and make the testing apparatus huge and consume additional power.

That is, the burn-in test to improve the reliability and quality of products consumes lots of power and increase the released carbon. Therefore, the traditional burn-in test violates the environmental concepts of low carbon footprint and energy-saving, and increases the cost to produce the products. Therefore, many burn-in test apparatuses are designed with energy recycle. And, such apparatuses can reduce the required power and time to meet the environmental concept of energy-saving and low carbon footprint.

The DC/DC power converter with energy recycle can be sorted to direct current type and alternating current type by the types of current recycled. For example, FIG. 1 illustrates the burn-in test apparatus, which recycles the direct current from the DC/DC power converter, and FIG. 2 illustrates the burn-in test apparatus, which recycles the alternating current from the DC/DC power converter. Thus, if the power converter to be tested is DC/DC power converter, the electricity will be recycled in direct current to the direct current side (shown in FIG. 1) or in alternating current to the mains supply (shown in FIG. 2).

And AC/DC power converter, DC/AC power converter, and uninterruptable power system (UPS) mainly feed the electricity to the mains supply. For example, FIG. 3 illustrates the burn-in test apparatus, which recycles the alternating current from UPS, or the DC/AC power converter, and FIG. 4 illustrates the burn-in test apparatus, which recycles the alternating current from the AC/DC power converter. Both structures of FIGS. 3 and 4 feed the electricity to the mains supply.

However, the current burn-in apparatuses for the AC/DC power converters mainly feed the alternating current to the mains supply, and need one more stage of DC/AC power converters, which are complicated and can recycle less electricity. Further, because the power of the mains supply is larger, the standard to connect to the mains supply is strict to avoid affecting the quality of the power, equipments, and safety of operators.

Thus, the invention provides a new electrical recycling apparatus for AC/DC power converter to recycle the electricity in direct current to the input ends of the power converter to be tested to save a stage of power converter and avoid the complicated standard and requirement that feed the electricity to the mains supply.

SUMMARY

The present invention provides a burn-in test apparatus with energy recycle comprising: an AC/DC power converter, of which input ends connects to an AC power source, wherein output ends of the AC/DC power converter output direct current; a testing block for mounting one or more power converters to be tested, wherein input side of the testing block connects to the output ends of the AC/DC power converter and is powered by the direct current from AC/DC power converter; an active electrical load, of which input ends connects to output side of the testing block to provide electrical load simulation for the one or more tested power converters to be tested, wherein the active electrical load makes the one or more tested power converters to be tested keep outputting constant current, and the active electrical load outputs the direct current; and an energy recycle line connecting output side of the active electrical load with the input side of the testing block to send the direct current back to the input side of the testing block from the output side of the active electrical load to recycle electricity.

Among them, the invention provides the single stage power converter structure to recycle the electrical power in direct current to the input ends of the power converters, and thus can save one stage of inverters and simplify the controlling and circuit.

Further, in another embodiment of the invention, the input ends of the power converters to be tested are connected in parallel, and the output ends of the power converters to be tested are connected in series. Therefore, the burn-in test can be executed on multiple power converters.

The invention possesses the following advantages: (1) single stage structure, which simplifies the controlling and circuit, and reduces the cost to manufacture; (2) high ratio of energy recycling, which is verified saving about 70% energy by the experiments; (3) recycling energy in direct current, which is not required to be connected to the mains supply, and thus can neglect the standard to connect to the mains supply;

DETAILED DESCRIPTION

Figure 1:
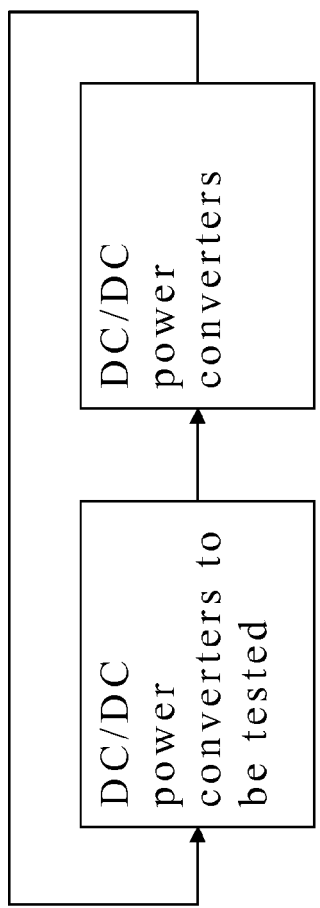
FIG. 1 illustrates the structure of the burn-in test apparatus that recycles the electricity in the direct current from the DC/DC power converter.
Figure 2:
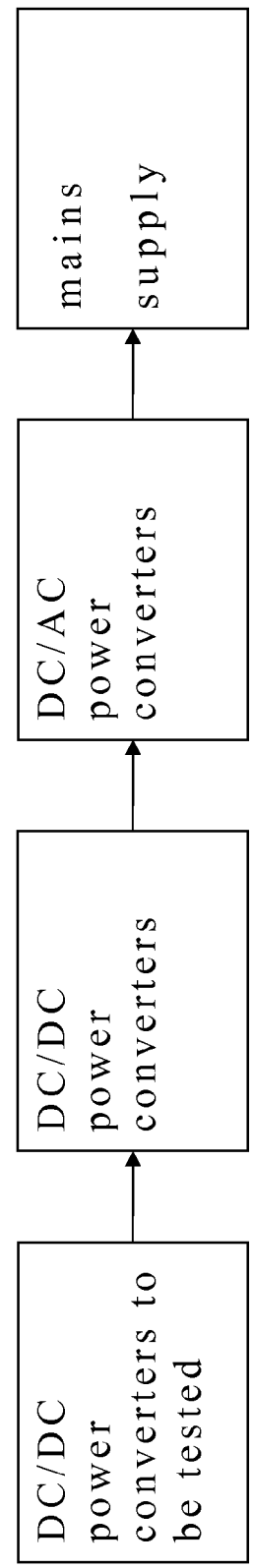
FIG. 2 illustrates the structure of the burn-in test apparatus that recycles the electricity in the alternating current from the DC/DC power converter.
Figure 3:
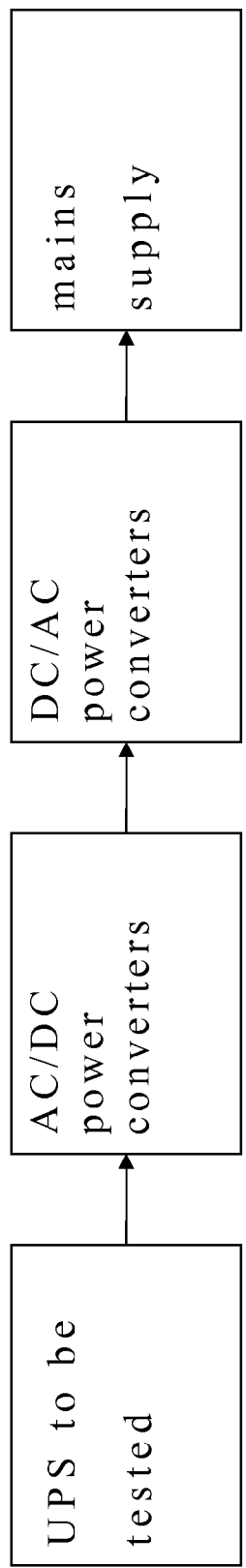
FIG. 3 illustrates the structure of the burn-in test apparatus that recycles the electricity in the alternating current from UPS or the DC/AC power converter.
Figure 4:
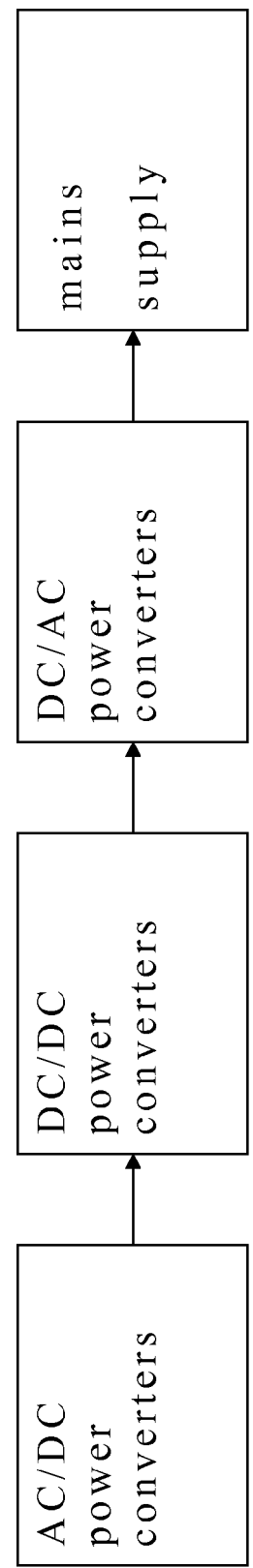
FIG. 4 illustrates the structure of the burn-in test apparatus that recycles the electricity in the alternating current from the AC/DC power converter.
Figure 5:
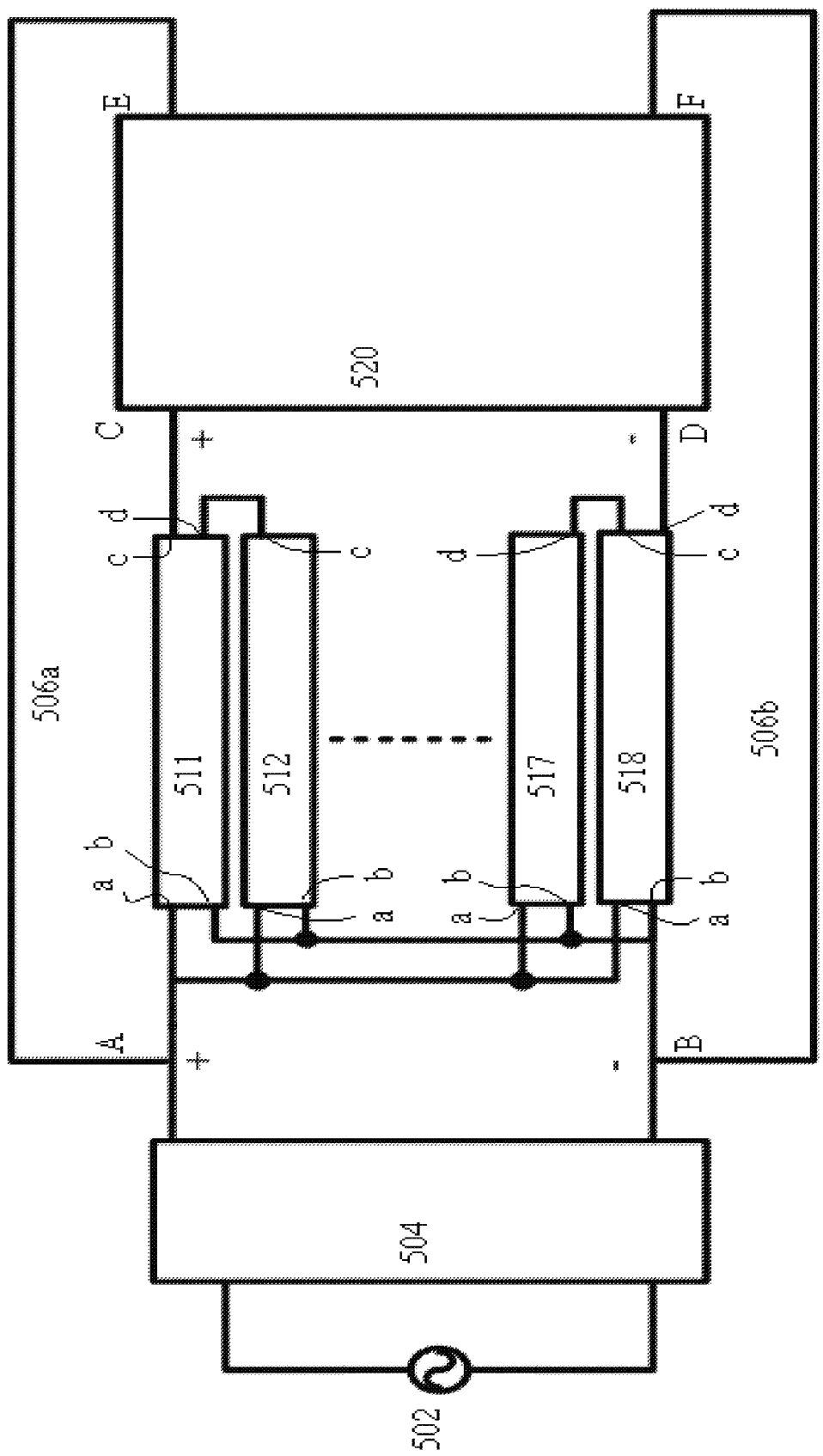
FIG. 5 illustrates a structure of a burn-in test apparatus on the basis of an embodiment of the invention.

FIG. 5 illustrates a structure of a burn-in test apparatus on the basis of an embodiment of the invention. FIG. 5 shows a burn-in test apparatus including an AC/DC power converter 504 and an active electrical load 520, wherein the AC/DC power converter 504 can be a full-bridge rectifier, and the active electrical load 520 can be a DC/DC power converter.

AC/DC power converter 504 mainly employs a full-bridge rectifier to convert the alternating current of the AC power source 502 of the mains supply to direct current, which is then supplied to the input ends (a, b) of one or more power converters (511~518). The voltage of the current into the one or more power converters (511~518) is regulated by the input capacitors inside the one or more power converters (511~518).

In an embodiment of the invention, to test multiple power converters (511~518) and reduce the test duration, the input ends (a, b) of power converter (511~518) are connected in parallel and the output ends (c, d) of power converters (511~518) are connected in series. Among them, because the direct current is used to input into the power converters (511~518), in all of the power converters (511~518), "a" input ends are positive electrodes, all of the "b" input ends are negative electrodes, "c" output ends are positive electrodes, and all of the "d" output ends are negative electrodes.

Then, the electric current flows into the active electrical load (520), which is used as the electrical load of the power converters (511~518), from the output side (C, D) of the power converters (511~518). Then, the electrical power is supplied in direct current from the output side (E, F) of the active electrical load 520 to the input side (A, B) of power converters (511~518) through the energy recycle line (506a, 506b), as shown in FIG. 5.

Because all of the input ends (a, b) of the power converters (511~518) are connected in parallel, the voltage difference, e.g., 311 volt, for a single power converter is enough to supply all of the power converters (511~518).

Further, output ends (c, d) of all of the power converters (511~518) are connected in series, and thus the voltage in the output side (C, D) of the power converters (511~518) is the sum of voltage differences of the power converters (511~518). For example, when there are 8 power converters of 12 volts to be tested, the sum of the voltage differences is 96.

For example, if the voltage of the AC power source 502 is 220 volts, up to 311 volts voltage difference will be required in the output side (E, F) of the active electrical load 520 to send the electricity back to the input side (A, B) of the power converters (511~518) through the energy recycle line (506a, 506b). Therefore, the higher voltage difference in the output side (C, D) of the power converters (511~518) is better to decrease the boost ratio of the active electrical load 520 to decrease the voltage-tolerance requirement of the elements inside the active electrical load 520 and the number of turns of the power converters to decrease the cost of manufacturing the active electrical load 520.

Thus, the output ends (c, d) of all of the power converters (511~518) are connected in parallel to raise the voltage difference of the output side (C, D) of the power converters (511~518) to achieve the goal for decreasing the boost ratio of the active electrical load 520.

Figure 6:
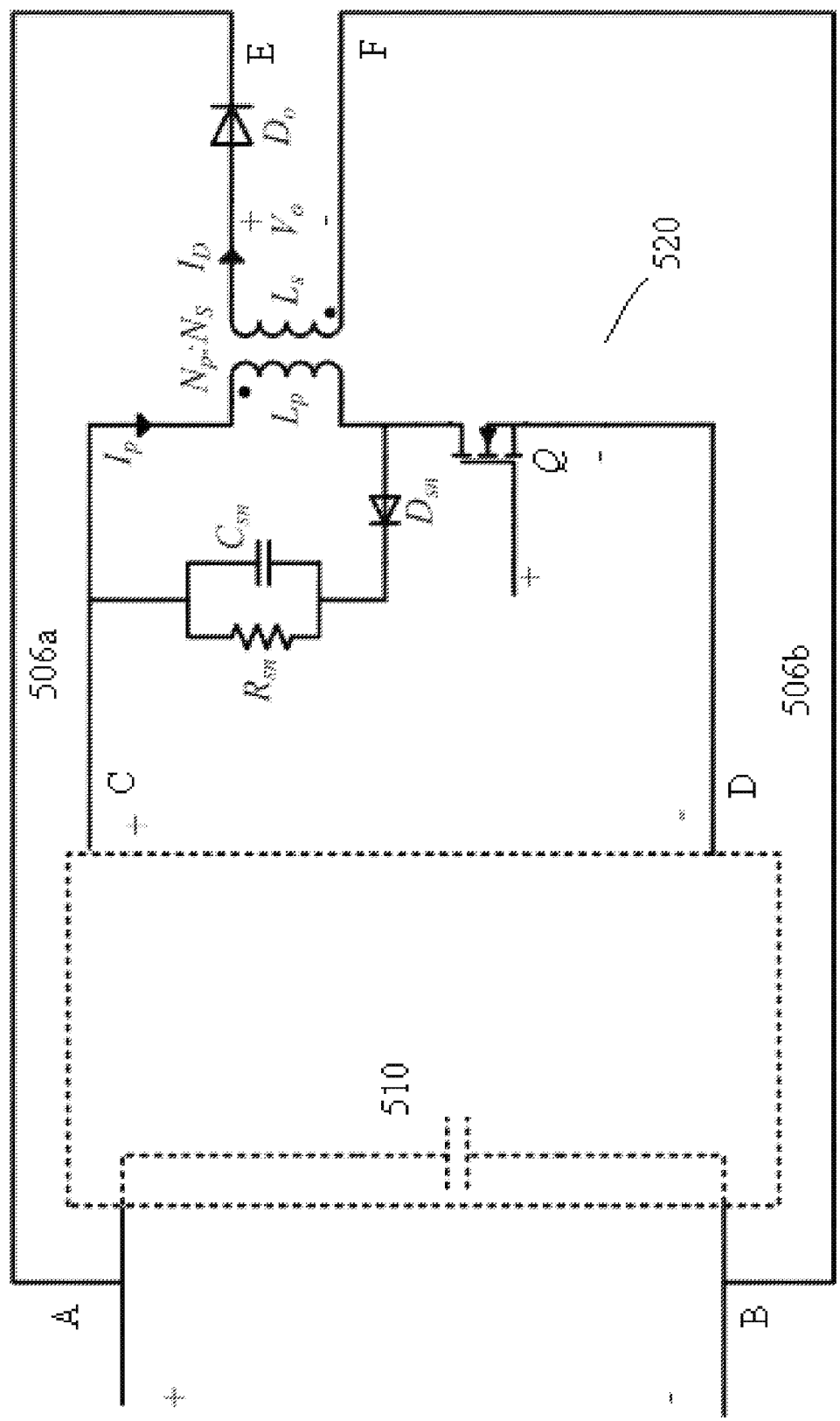
FIG. 6 illustrates the circuit inside the active electrical load in FIG. 5.

FIG. 6 illustrates the circuit inside the active electrical load 520 in FIG. 5. The active electrical load 520 mainly comprises the Flyback type circuit, including: a boosting transform comprising a inductor $L_P$ of $N_P$ turns and a conductor $L_s$ of $N_s$ turns; a RCD type snubber comprising the snubber capacitor $C_{sn}$ and snubber resistor $R_{sn}$, which are connected in parallel, and being connected with a snubber diode $D_{sn}$ in series; an enhancement mode metal oxide semiconductor field effect transistor Q; a diode $D_q$ connected to both ends of the enhancement mode metal oxide semiconductor field effect transistor Q; and an output diode $D_O$.

The active electrical load further comprises a boosting transformer in an inner circuit thereof, the RCD type snubber is connected with the boosting transformer, and the unity of them are connected with the enhancement mode metal oxide semiconductor field effect transistor Q. After the current $I_P$ flows through the inductor $L_S$, the conductor $L_S$ will produce the direct current $I_D$ and the output voltage $V_O$. After flowing through the output diode, the direct current $I_D$ will pass the output side E of the active electrical load 520, and then go back to the input side A of the testing block 510 through the energy recycle line 506a. Wherein, the test block 510 is where to mount the one or more power converters (511~518).

To sum up, the main function of the active electrical load 520 is to provide the simulation of the electrical load property for the power converters (511~518), keep the power converters (511~518) output the constant current, and recycle the electrical power.

The above-mentioned content is used to clarify the purposes of the present invention and the technical means to achieve these purposes, and the advantages resulted from the present invention and so on. The present invention can be understood on the basis of the following preferred embodiments of the description, the accompanying drawings, and the claims. The above-mentioned content is used to clarify the purposes of the present invention and the technical means to achieve these purposes, and the advantages resulted from the present invention and so on. The present invention can be understood on the basis of the following preferred embodiments of the description, the accompanying drawings, and the claims.

What is claimed is:

1. A burn-in test apparatus with the function of energy recycling, comprising:
   an AC/DC power converter with an input end connected to an AC power source and an output end providing a first DC voltage;
   a testing block with an input side and an output side for mounting a power converter to be tested, wherein the input side of the testing block is connected to the output end of the AC/DC power converter and powered by the first DC voltage provided therefrom;

an active electrical load with an input end and an output end, wherein the input end thereof connects to the output side of the testing block to simulate an electrical load for the power converter to be tested, thereby the active electrical load allows the power converter to be tested to output a constant current, so as to allow the output end of the active electrical load to output a direct current; and an energy recycle line connecting the output end of the active electrical load with the input side of the testing block to transmit the direct current from the output end of the active electrical load back to the input side of the testing block.

2. The burn-in test apparatus of claim 1, wherein the AC/DC power converter is a full-bridge rectifier.

3. The burn-in test apparatus of claim 1, wherein at least two power converters to be test are mounted to the testing block, and each power converter has an input end and an output end.

4. The burn-in test apparatus of claim 3, wherein the input ends of the power converters to be tested are connected in parallel.

5. The burn-in test apparatus of claim 3, wherein the input ends of the power converters to be tested are connected in series.

6. The burn-in test apparatus of claim 3, wherein the output ends of the power converters to be tested are connected in parallel.

7. The burn-in test apparatus of claim 3, wherein the output ends of the power converters to be tested are connected in series.

8. The burn-in test apparatus of claim 1, wherein the active electrical load further comprises a boosting transformer in an inner circuit thereof.

9. The burn-in test apparatus of claim 8, wherein circuit of the active electrical load further comprises a RCD type snubber connected with the boosting transformer in parallel in the inner circuit thereof, wherein the RCD type snubber comprises a resistor, a capacitor and a diode.

10. The burn-in test apparatus of claim 9, wherein a diode is connected in series with a unity of the capacitor and the resistor connected in parallel.

11. The burn-in test apparatus of claim 9, wherein the circuit of the active electrical load further comprises an enhancement mode metal oxide semiconductor field effect transistor in the inner circuit thereof.

12. The burn-in test apparatus of claim 11, wherein the circuit of the active electrical load further comprises an diode connected to both ends of the enhancement mode metal oxide semiconductor field effect transistor.

13. The burn-in test apparatus of claim 11, wherein a unity of the RCD type snubber and the boosting transformer is connected with the enhancement mode metal oxide semiconductor field effect transistor in parallel.

* * * * *